United States Patent
Abiru et al.

(10) Patent No.: US 10,211,879 B2
(45) Date of Patent: Feb. 19, 2019

(54) FRONT-END MODULE

(71) Applicant: Murata Manufacturing Co., Ltd., Kyoto (JP)

(72) Inventors: Takeshi Abiru, Kyoto (JP); Koji Yamashita, Kyoto (JP); Takeshi Kogure, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/920,860

(22) Filed: Mar. 14, 2018

(65) Prior Publication Data

US 2018/0269922 A1    Sep. 20, 2018

(30) Foreign Application Priority Data

Mar. 15, 2017 (JP) ................. 2017-049954

(51) Int. Cl.
| | |
|---|---|
| *H04B 1/44* | (2006.01) |
| *H04B 1/525* | (2015.01) |
| *H04B 1/50* | (2006.01) |
| *H03H 7/24* | (2006.01) |

(52) U.S. Cl.
CPC ............... *H04B 1/50* (2013.01); *H03H 7/24* (2013.01)

(58) Field of Classification Search
CPC ........ H01B 1/006; H01B 1/04; H01B 1/0475; H01B 1/40; H01B 1/44; H01B 1/48; H01B 1/525; H01B 15/00; H03F 3/195; H03F 2200/451
USPC ... 455/63.1, 67.13, 69, 70, 78, 84, 295, 296, 455/82, 83
See application file for complete search history.

(56) References Cited

U.S. PATENT DOCUMENTS

| | | | | |
|---|---|---|---|---|
| 7,062,235 | B2 * | 6/2006 | Henriksson | H04W 24/06 455/115.1 |
| 7,561,005 | B2 * | 7/2009 | Harada | H03H 7/463 455/83 |
| 8,644,197 | B2 * | 2/2014 | Lee | H01Q 9/40 455/575.7 |
| 8,897,722 | B2 * | 11/2014 | Mikhemar | H04B 1/525 455/78 |
| 9,160,397 | B2 | 10/2015 | Uejima | |
| 9,214,920 | B2 | 12/2015 | Link et al. | |

(Continued)

FOREIGN PATENT DOCUMENTS

| | | |
|---|---|---|
| JP | 5590134 B2 | 9/2014 |
| WO | 2010/087307 A1 | 8/2012 |

*Primary Examiner* — Quochien B Vuong
(74) *Attorney, Agent, or Firm* — Pearne & Gordon LLP

(57) ABSTRACT

A front-end module includes a duplexer, a band pass filter, and a terminating circuit element. A first signal path connects an output terminal of a power amplifier and a transmit node of the duplexer. The band pass filter is disposed on a second signal path between a branch point and a ground. The second signal path branches off from the first signal path at the branch point. The band pass filter has frequency characteristics in which, among frequency components of a transmit signal output from the power amplifier, frequency components that overlap at least part of the pass band of a receive filter of the duplexer are allowed to pass through the band pass filter. The terminating circuit element is disposed on the second signal path between the band pass filter and the ground. The terminating circuit element attenuates a transmit signal passing through the band pass filter.

14 Claims, 13 Drawing Sheets

(56) References Cited

U.S. PATENT DOCUMENTS

| | | | |
|---|---|---|---|
| 9,231,552 B2* | 1/2016 | Taniuchi | H03H 7/465 |
| 9,571,133 B2 | 2/2017 | Schmidhammer et al. | |
| 9,825,665 B2* | 11/2017 | Mirzaei | H04B 1/525 |
| 2011/0027919 A1 | 2/2011 | Wack et al. | |
| 2015/0295559 A1 | 10/2015 | White et al. | |

* cited by examiner

FRONT-END MODULE

This application claims priority from Japanese Patent Application No. 2017-049954 filed on Mar. 15, 2017. The content of this application is incorporated herein by reference in its entirety.

BACKGROUND

The present disclosure relates to a front-end module. Among mobile communication terminals, such as cellular phones, some transmit and receive signals by using a single common antenna. This type of mobile communication terminal includes a duplexer for separating a transmit signal and a received signal from each other. The duplexer includes a transmit filter and a receive filter. The transmit filter has frequency characteristics in which the frequency band of a transmit signal is the pass band and the frequency band of a received signal is the elimination band. The receive filter has frequency characteristics in which the frequency band of a received signal is the pass band and the frequency band of a transmit signal is the elimination band. By attenuating unwanted components of a transmit signal and those of a received signal and by securing isolation between the transmit signal and the received signal, a leakage of the transmit signal to a received signal path can be reduced so as to maintain the reception characteristics. Such a duplexer is disclosed in Japanese Patent No. 5590134, for example.

BRIEF SUMMARY

If the frequency band of a transmit signal and that of a received signal are close to each other, it is difficult to secure sufficient isolation between the transmit signal and the received signal. This may cause a leakage of the transmit signal to a received signal path, which may decrease the reception characteristics.

Accordingly, the present disclosure maintains the reception characteristics which would otherwise be decreased by a leakage of a transmit signal to a received signal path.

A front-end module according to an embodiment of the disclosure includes a duplexer, a band pass filter, and a terminating circuit element. The duplexer has a transmit node, a receive node, and a common node. A first signal path connects the transmit node and an output terminal of a power amplifier. The duplexer includes a transmit filter and a receive filter. The transmit filter has frequency characteristics in which a frequency band of a transmit signal passing through the transmit node and the common node is a pass band and a frequency band of a received signal passing through the common node and the receive node is an elimination band. The receive filter has frequency characteristics in which the frequency band of the received signal is a pass band and the frequency band of the transmit signal is an elimination band. The band pass filter is disposed on a second signal path between a branch point and a ground. The second signal path branches off from the first signal path at the branch point. The band pass filter has frequency characteristics in which, among frequency components of the transmit signal output from the power amplifier, frequency components of the elimination band of the transmit filter are allowed to pass through the band pass filter. The terminating circuit element is disposed on the second signal path between the band pass filter and the ground. The terminating circuit element attenuates the transmit signal passing through the band pass filter.

By using a front-end module according to an embodiment of the disclosure, it is possible to maintain the reception characteristics which would otherwise be decreased by a leakage of a transmit signal to a received signal path.

Other features, elements, characteristics and advantages of the present disclosure will become more apparent from the following detailed description of embodiments of the present disclosure with reference to the attached drawings.

DETAILED DESCRIPTION

Figure 1:
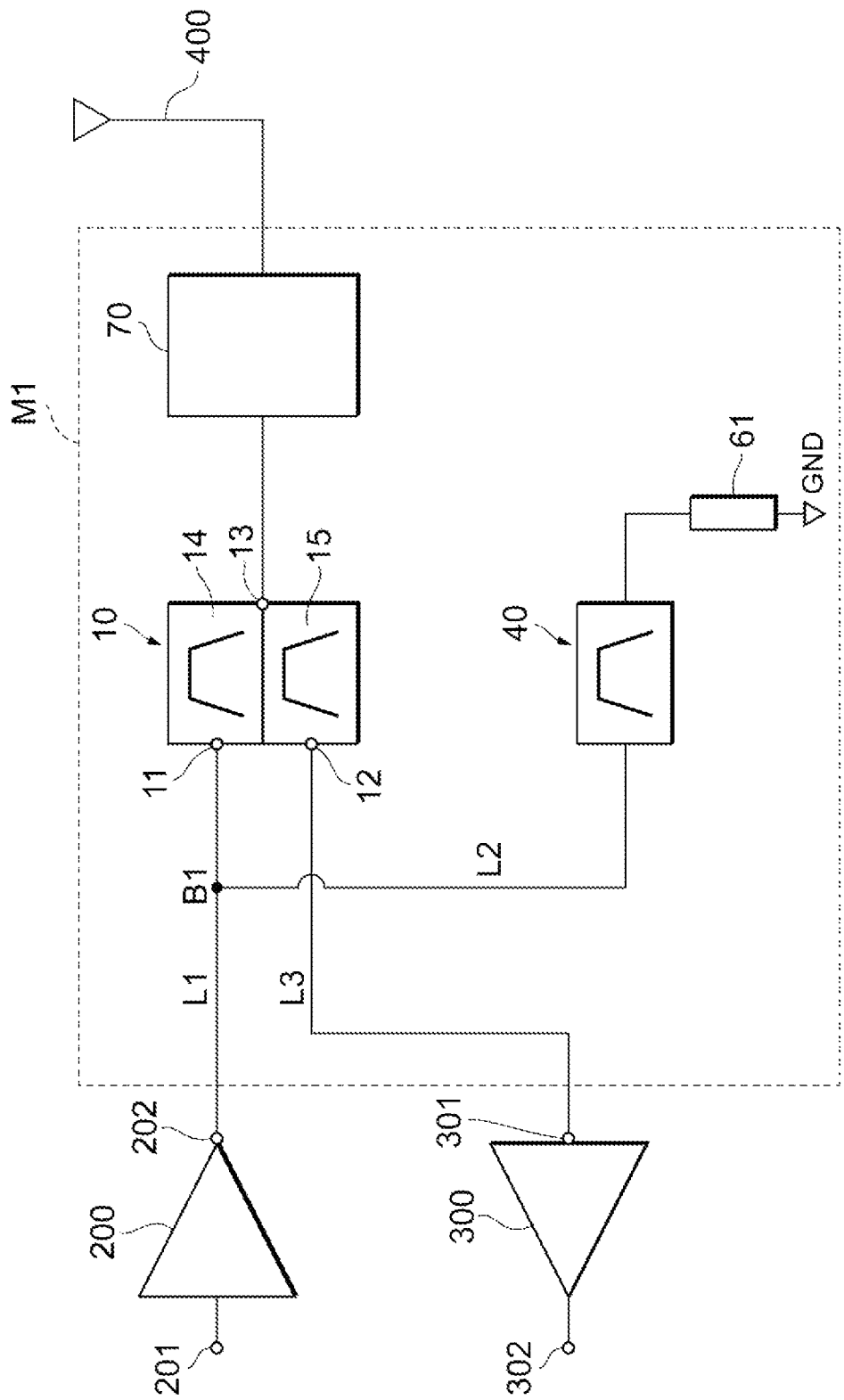
FIG. 1 illustrates the circuit configuration of a front-end module according to a first embodiment of the disclosure.

Front-end modules according to the embodiments of the present disclosure support multiband communication. The front-end modules perform filtering of multiple transmit signals having frequency bands different from each other and multiple received signals having frequency bands different from each other, and also perform switching between signal paths. For example, when three transmit signals are distinguished from each other, they are called a transmit signal A, a transmit signal B, and a transmit signal C. When three transmit signals are not distinguished from each other, they are simply called a transmit signal or transmit signals. Likewise, for example, when three received signals are distinguished from each other, they are called a received signal A, a received signal B, and a received signal C. When three received signals are not distinguished from each other, they are simply called a received signal or received signals. The expression "two frequency bands are different from each other" includes a situation where they are completely different without necessarily any overlapping portion and also a situation where they are not exactly the same although they have an overlapping portion. A transmit signal and a received signal are radio frequency (RF) signals which are modulated by a predetermined communication method.

The embodiments of the disclosure will be described below with reference to FIGS. 1 through 4, and examples of the disclosure will be described below with reference to FIGS. 5 through 13. The examples correspond to subordinate concepts of the associated embodiments and also support multiband communication. The same circuit element is designated by like reference numeral, and the same explanation thereof will not be repeated.

FIG. 1 illustrates the circuit configuration of a front-end module M1 according to a first embodiment of the disclosure. The front-end module M1 performs filtering of a transmit signal A to be transmitted to a base station via an antenna 400 and a received signal A received from the base station via the antenna 400 and also performs switching between signal paths. The front-end module M1 includes a duplexer 10, a band pass filter 40, a terminating circuit element 61, and an antenna switch 70.

A power amplifier 200 includes an input terminal 201 and an output terminal 202. The power amplifier 200 amplifies power of the transmit signal A received from a radio frequency integrated circuit (RFIC) via the input terminal 201 and outputs the amplified signal from the output terminal 202. A low-noise amplifier 300 includes an input terminal 301 and an output terminal 302. The low-noise amplifier 300 amplifies the received signal A input into the input terminal 301 without necessarily significantly increasing noise and outputs the amplified signal from the output terminal 302.

The duplexer 10 is a separator which separates the transmit signal A and the received signal A from each other. The duplexer 10 includes a transmit node 11, a receive node 12, a common node 13, a transmit filter 14, and a receive filter 15. The transmit node 11 is connected to the output terminal 202 of the power amplifier 200. A signal path which connects the output terminal 202 of the power amplifier 200 and the transmit node 11 of the duplexer 10 is called a signal path L1. The receive node 12 is connected to the input terminal 301 of the low-noise amplifier 300. A signal path which connects the input terminal 301 of the low-noise amplifier 300 and the receive node 12 of the duplexer 10 is called a signal path L3. The common node 13 is connected to the antenna 400 via the antenna switch 70. The transmit filter 14 has frequency characteristics in which the frequency band of the transmit signal A is the pass band and the frequency band of the received signal A is the elimination band. The receive filter 15 has frequency characteristics in which the frequency band of the received signal A is the pass band and the frequency band of the transmit signal A is the elimination band.

The transmit signal A input from the power amplifier 200 into the transmit node 11 via the signal path L1 passes through the transmit filter 14 and is output from the common node 13. The transmit signal A output from the common node 13 then passes through the antenna switch 70 and is transmitted from the antenna 400. The received signal A received from the antenna 400 passes through the antenna switch 70 and is input into the common node 13. The received signal A input into the common node 13 then passes through the receive filter 15 and is output from the receive node 12. The received signal A output from the receive node 12 is then input into the low-noise amplifier 300 via the signal path L3.

The band pass filter 40 is disposed on a signal path between a branch point B1 and a ground GND. This signal path branches off from the signal path L1 at the branch point B1. The signal path between the branch point B1 and the ground GND is called a signal path L2. The band pass filter 40 has frequency characteristics in which unwanted components of the transmit signal A output from the power amplifier 200 are allowed to pass through the band pass filter 40. The unwanted components of the transmit signal A are frequency components of the transmit signal A that overlap at least part of the pass band (Rx band) of the receive filter 15. The terminating circuit element 61 is disposed on the signal path L2 between the band pass filter 40 and the ground GND and attenuates the unwanted components of the transmit signal A passing through the band pass filter 40. The terminating circuit element 61 may be a resistor element or a circuit element, such as an inductor element or a capacitor element. The terminating circuit element 61 may alternatively be a combined element of a resistor element and an inductor element or a capacitor element connected in parallel with a resistor element.

The unwanted components of the transmit signal A output from the power amplifier 200 are not mainly input into the duplexer 10, but are input into the band pass filter 40 via the branch point B1 and passes through the band pass filter 40 via the signal path L2. The unwanted components of the transmit signal A are then attenuated by the terminating circuit element 61. In this manner, the unwanted components of the transmit signal A can be blocked before being input into the duplexer 10. This can maintain the reception characteristics which would otherwise be decreased by a leakage of the unwanted components of the transmit signal A to the signal path L3.

Figure 2:
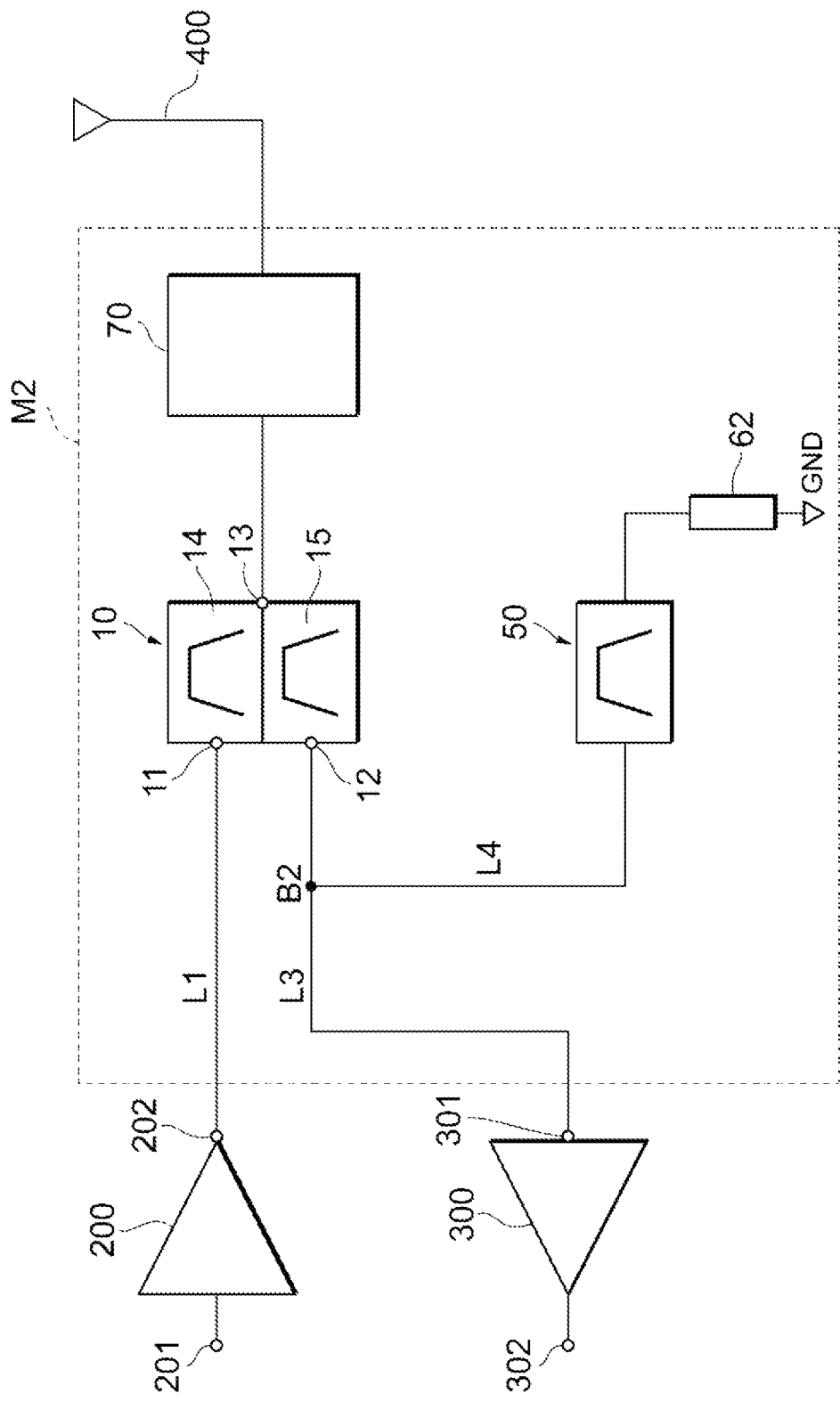
FIG. 2 illustrates the circuit configuration of a front-end module according to a second embodiment of the disclosure.

FIG. 2 illustrates the circuit configuration of a front-end module M2 according to a second embodiment of the disclosure. The front-end module M2 includes a duplexer 10, a band pass filter 50, a terminating circuit element 62, and an antenna switch 70. The front-end module M2 is different from the front-end module M1 in that it includes the band pass filter 50 and the terminating circuit element 62. The front-end module M2 will be described below mainly by referring to the points different from the front-end module M1, and a detailed explanation of the same points will be omitted.

As in the front-end module M1, the signal path L3 connects the input terminal 301 of the low-noise amplifier 300 and the receive node 12 of the duplexer 10. The band pass filter 50 is disposed on a signal path between a branch point B2 and a ground GND. This signal path branches off from the signal path L3 at the branch point B2. The signal path between the branch point B2 and the ground GND is called a signal path L4. The band pass filter 50 has frequency characteristics in which leakage components of the transmit signal A are allowed to pass through the band pass filter 50. The leakage components of the transmit signal A are frequency components of the transmit signal A output from the power amplifier 200 and input into the transmit node 11 that overlap at least part of the pass band (Tx band) of the transmit filter 14 and that are output from the receive node 12. The terminating circuit element 62 is disposed on the signal path L4 between the band pass filter 50 and the ground GND and attenuates the leakage components of the transmit signal A passing through the band pass filter 50.

The leakage components of the transmit signal A output from the duplexer 10 are not mainly input into the low-noise amplifier 300, but are input into the band pass filter 50 via the branch point B2 and pass through the band pass filter 50 via the signal path L4. The leakage components of the transmit signal A are then attenuated by the terminating circuit element 62. In this manner, the leakage components of the transmit signal A can be blocked before being input into the low-noise amplifier 300. This can maintain the reception characteristics which would otherwise be decreased by a leakage of the leakage components of the transmit signal A to the signal path L3.

Figure 3:
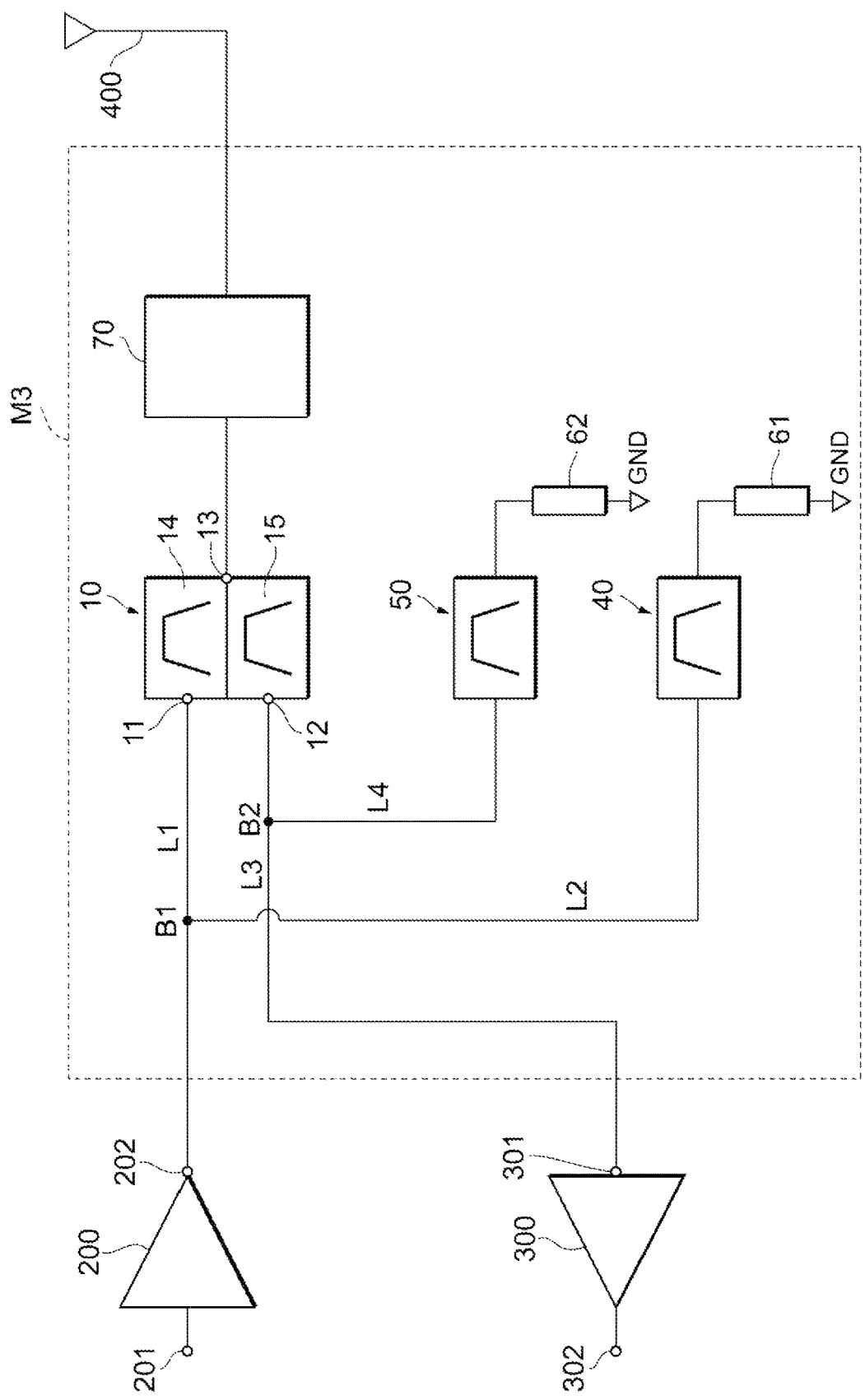
FIG. 3 illustrates the circuit configuration of a front-end module according to a third embodiment of the disclosure.

FIG. 3 illustrates the circuit configuration of a front-end module M3 according to a third embodiment of the disclosure. The front-end module M3 includes a duplexer 10, band pass filters 40 and 50, terminating circuit elements 61 and 62, and an antenna switch 70. The front-end module M3 is constituted by a combination of the front-end modules M1 and M2. The front-end module M3 thus achieves advantages similar to those of the front-end module M1 and those of the front-end module M2.

Figure 4:
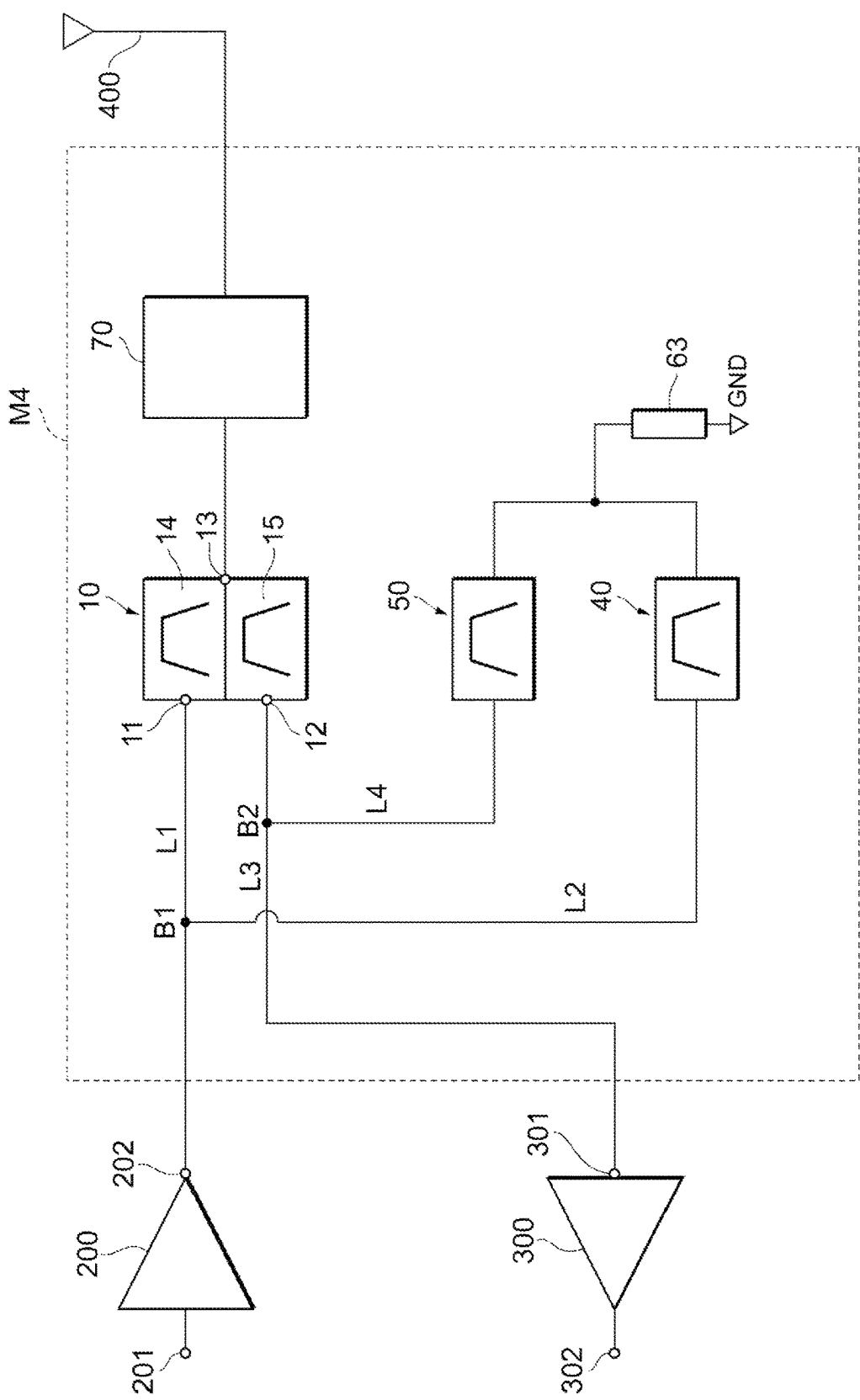
FIG. 4 illustrates the circuit configuration of a front-end module according to a fourth embodiment of the disclosure.

FIG. 4 illustrates the circuit configuration of a front-end module M4 according to a fourth embodiment of the disclosure. The front-end module M4 includes a duplexer 10, band pass filters 40 and 50, a terminating circuit element 63, and an antenna switch 70. The terminating circuit element 63 of the front-end module M4 has both the functions of the terminating circuit elements 61 and 62 of the front-end module M3. The front-end module M4 will be described below mainly by referring to the points different from the front-end module M3, and a detailed explanation of the same points will be omitted.

The terminating circuit element 63 is disposed on the signal path L2 between the band pass filter 40 and a ground GND and also on the signal path L4 between the band pass filter 50 and the ground GND. That is, one end of the terminating circuit element 63 is connected to the band pass filters 40 and 50 via a node therebetween, and the other end of the terminating circuit element 63 is connected to the ground GND. The terminating circuit element 63 attenuates unwanted components of the transmit signal A passing through the band pass filter 40 and also attenuates leakage components of the transmit signal A passing through the band pass filter 50. The front-end module M4 achieves advantages similar to those of the front-end module M3.

Figure 5:
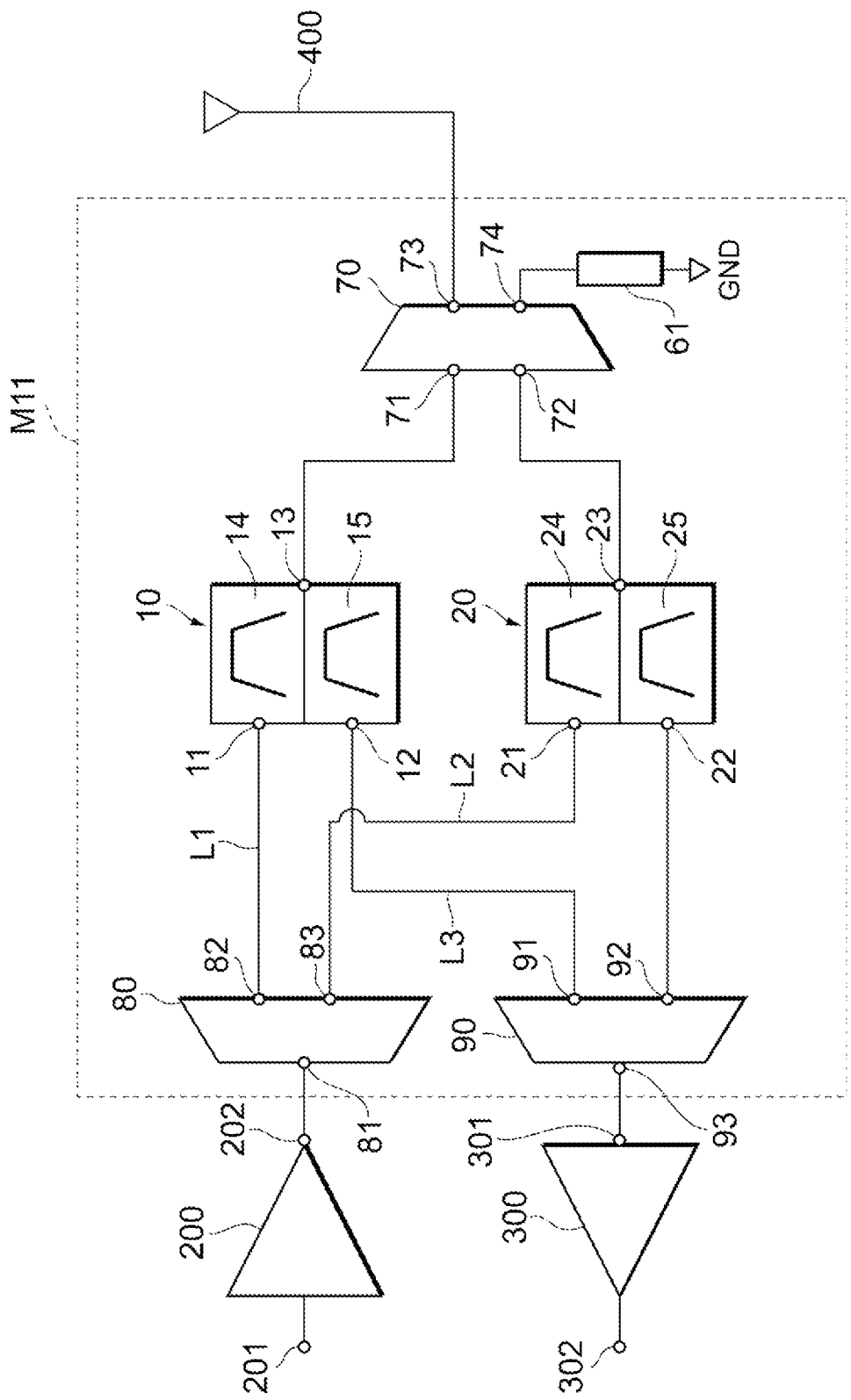
FIG. 5 illustrates the circuit configuration of a front-end module according to a first example of the disclosure.

FIG. 5 illustrates the circuit configuration of a front-end module M11 according to a first example of the disclosure. The front-end module M11 includes duplexers 10 and 20, a terminating circuit element 61, an antenna switch 70, a transmitted-signal changing switch 80, and a received-signal changing switch 90. The front-end module M11 corresponds to an example of the front-end module M1 of the first embodiment, and includes all the elements of the front-end module M1. Although the band pass filter 40 in FIG. 1 is not shown in FIG. 5, a transmit filter 24 of the duplexer 20 serves as the band pass filter 40. The front-end module M11 will be described below mainly by referring to the points different from the front-end module M1, and a detailed explanation of the same points will be omitted.

The duplexer 20 is a separator which separates a transmit signal B and a received signal B from each other. The duplexer 20 includes a transmit node 21, a receive node 22, a common node 23, a transmit filter 24, and a receive filter 25. The transmit filter 24 has frequency characteristics in which the frequency band of the transmit signal B is the pass band and the frequency band of the received signal B is the elimination band. The receive filter 25 has frequency characteristics in which the frequency band of the received signal B is the pass band and the frequency band of the transmit signal B is the elimination band.

The transmit filter 24 has frequency characteristics in which frequency components of the transmit signal A that overlap at least part of the pass band of the receive filter 15 are allowed to pass through the transmit filter 24. That is, the pass band of the transmit filter 24 and the pass band of the receive filter 15 overlap each other.

The transmit-signal changing switch 80 includes nodes 81, 82, and 83, and selectively establishes a signal path among the nodes 81, 82, and 83. In one example, the transmit-signal changing switch 80 receives the transmit signal A from the power amplifier 200 via the node 81 and outputs the transmit signal A from the node 82. The node 82 is connected to the transmit node 11 of the duplexer 10 via the signal path L1. In another example, the transmit-signal changing switch 80 receives the transmit signal B from the power amplifier 200 via the node 81 and outputs the transmit signal B from the node 83. The node 83 is connected to the transmit node 21 of the duplexer 20 via the signal path L2.

The antenna switch 70 includes nodes 71, 72, 73, and 74, and selectively establishes a signal path among the nodes 71, 72, 73, and 74. In one example, the antenna switch 70 receives the transmit signal A from the common node 13 of the duplexer 10 via the node 71 and outputs the transmit signal A from the node 73. In another example, the antenna switch 70 receives the transmit signal B from the common node 23 of the duplexer 20 via the node 72 and outputs the transmit signal B from the node 73. The node 73 is connected to the antenna 400, and the transmit signals A and B output from the node 73 are transmitted from the antenna 400.

The received-signal changing switch 90 includes nodes 91, 92, and 93, and selectively establishes a signal path among the nodes 91, 92, and 93. In one example, the received-signal changing switch 90 receives the received signal A output from the receive node 12 of the duplexer 10 and input into the node 91 via the signal path L3 and outputs the received signal A from the node 93. In another example, the received-signal changing switch 90 receives the received signal B from the receive node 22 of the duplexer 20 via the node 92 and outputs the received signal B from the node 93. The node 93 is connected to the low-noise amplifier 300, and the received signals A and B output from the node 93 are input into the low-noise amplifier 300.

While the duplexer 10 is being used for filtering of the transmit signal A, the duplexer 20 is not used for filtering of the transmit signal B. Hence, while the duplexer 10 is being used for filtering of the transmit signal A, the duplexer 20 (transmit filter 24, for example) can be used for removing unwanted components of the transmit signal A so as to prevent the unwanted components from being input into the duplexer 10. The transmit-signal changing switch 80 receives the transmit signal A via the node 81 and outputs the transmit signal A from the nodes 82 and 83. In this case, the antenna switch 70 establishes a signal path between the nodes 72 and 74. The terminating circuit element 61 is connected between the node 74 and the ground GND. With this configuration, a signal path from the node 81 of the transmit-signal changing switch 80 to the ground GND is established via the node 83, the transmit filter 24, the nodes 72 and 74 of the antenna switch 70, and the terminating circuit element 61 in this order. This signal path corresponds to the signal path L2 in FIG. 1, and the transmit-signal changing switch 80 serves as the branch point B1 in FIG. 1.

In this manner, by using the duplexer 20 which is not used for filtering of the transmit signal B, the unwanted components of the transmit signal A can be removed. This can maintain the reception characteristics which would otherwise be decreased by a leakage of the unwanted components of the transmit signal A to the signal path L3. Additionally, the duplexer 20, which is a pre-equipped duplexer, can be used without necessarily the need to provide a special band pass filter for removing the unwanted components of the transmit signal A, thereby reducing the cost and also decreasing the size of the front-end module M11.

As the duplexer 10, a Band-26 duplexer may be used, and as the duplexer 20, a Band-8 duplexer may be used. The receive band of Band 26 is about 859 to 894 MHz, and the transmit band of Band 8 is about 880 to 915 MHz. The receive band of Band 26 and the transmit band of Band 8 overlap each other. Hence, by using the transmit filter of a Band-8 duplexer, unwanted components of the transmit band of Band 26 can be removed. By using the transmit filter of a Band-26 duplexer, unwanted components of the transmit band of Band 20 can be removed. By using the transmit filter of a Band-26 duplexer, unwanted components of the transmit band of Band 27 can also be removed. By using the transmit filter of a Band-27 duplexer, unwanted components of the transmit band of Band 20 can be removed. By using the transmit filter of a Band-23, Band-34, or Band-36 duplexer, unwanted components of the transmit band of Band 2 can be removed.

Figure 6:
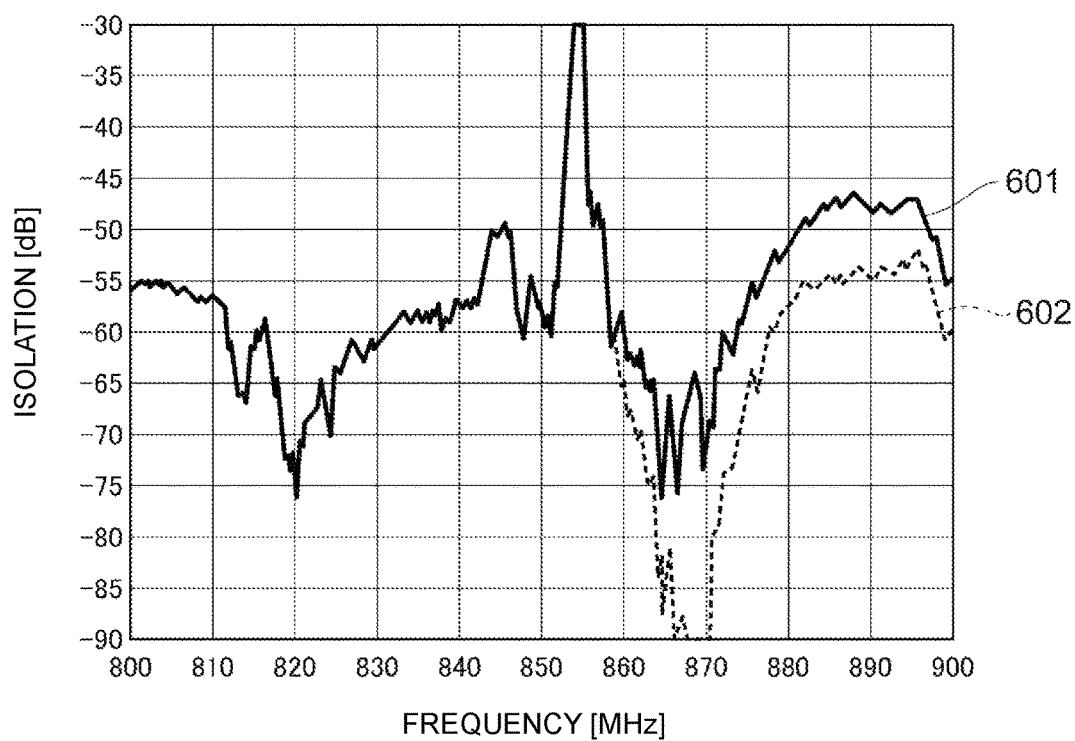
FIG. 6 is a graph illustrating simulation results of the isolation characteristics representing isolation between a transmit signal and a received signal in a duplexer according to the first example.

FIG. 6 is a graph illustrating simulation results of the isolation characteristics representing isolation between the transmit signal A and the received signal A in the duplexer 10 according to the first example. A solid line 601 in the graph indicates the isolation characteristics when unwanted components of the transmit signal A are not removed. A dotted line 602 in the graph indicates the isolation characteristics when unwanted components of the transmit signal A are removed by using the duplexer 20. These simulation results show that the isolation characteristics are improved by about 8 dB by removing the unwanted components of the transmit signal A by using the duplexer 20.

Figure 7:
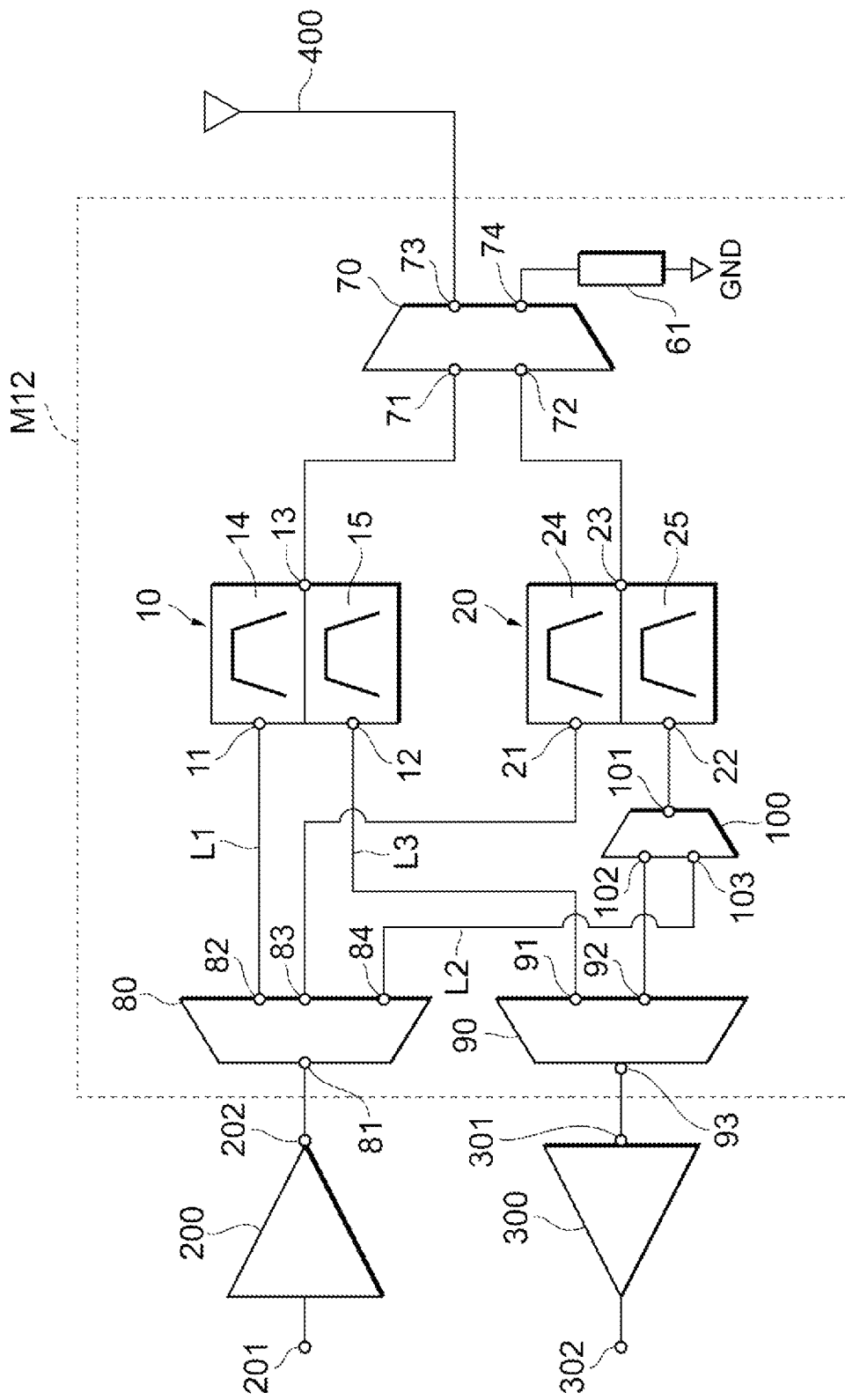
FIG. 7 illustrates the circuit configuration of a front-end module according to a second example of the disclosure.

FIG. 7 illustrates the circuit configuration of a front-end module M12 according to a second example of the disclosure. The front-end module M12 includes duplexers 10 and 20, a terminating circuit element 61, an antenna switch 70, a transmit-signal changing switch 80, a received-signal changing switch 90, and a switch 100. The front-end module M12 corresponds to an example of the front-end module M1 of the first embodiment, and includes all the elements of the front-end module M1. Although the band pass filter 40 in FIG. 1 is not shown in FIG. 7, a receive filter 25 of the duplexer 20 serves as the band pass filter 40. The front-end module M12 will be described below mainly by referring to the points different from the front-end module M11, and a detailed explanation of the same points will be omitted.

The transmit-signal changing switch 80 includes nodes 81, 82, 83, and 84, and selectively establishes a signal path among the nodes 81, 82, 83, and 84. In one example, the transmit-signal changing switch 80 receives the transmit signal A from the power amplifier 200 via the node 81 and outputs the transmit signal A from the node 82. The node 82 is connected to the transmit node 11 of the duplexer 10 via the signal path L1. In another example, the transmit-signal changing switch 80 receives the transmit signal B from the power amplifier 200 via the node 81 and outputs the transmit signal B from the node 83. The node 83 is connected to the transmit node 21 of the duplexer 20.

The switch 100 includes nodes 101, 102, and 103, and selectively establishes a signal path among the nodes 101, 102, and 103. For example, the switch 100 receives the received signal B from the receive node 22 of the duplexer 20 via the node 101 and outputs the received signal B from the node 102. The node 102 is connected to the node 92 of the received-signal changing switch 90.

The received-signal changing switch 90 includes nodes 91, 92, and 93, and selectively establishes a signal path among the nodes 91, 92, and 93. In one example, the received-signal changing switch 90 receives the received signal A output from the receive node 12 of the duplexer 10 and input into the node 91 via the signal path L3 and outputs the received signal A from the node 93. In another example, the received-signal changing switch 90 receives the received signal B output from the receive node 22 of the duplexer 20 and input into the node 92 via the switch 100 and outputs the received signal B from the node 93. The node 93 is connected to the low-noise amplifier 300, and the received signals A and B output from the node 93 are input into the low-noise amplifier 300.

While the duplexer 10 is being used for filtering of the transmit signal A, the duplexer 20 is not used for filtering of the transmit signal B. Hence, while the duplexer 10 is being used for filtering of the transmit signal A, the duplexer 20 (receive filter 25, for example) can be used for removing unwanted components of the transmit signal A so as to prevent the unwanted components from being input into the duplexer 10. The transmit-signal changing switch 80 receives the transmit signal A via the node 81 and outputs the transmit signal A from the nodes 82 and 84. In this case, the antenna switch 70 establishes a signal path between the nodes 72 and 74, and the switch 100 establishes a signal path between the nodes 103 and 101. With this configuration, a signal path from the node 81 of the transmit-signal changing switch 80 to the ground GND is established via the node 84, the switch 100, the receive filter 25, the nodes 72 and 74 of the antenna switch 70, and the terminating circuit element 61 in this order. This signal path corresponds to the signal path L2 in FIG. 1, and the transmit-signal changing switch 80 serves as the branch point B1 in FIG. 1. The front-end module M12 achieves advantages similar to those of the front-end module M11.

By using the receive filter of a Band-4, Band-10, or Band-23 duplexer, unwanted components of the transmit band of Band 1 can be removed.

Figure 8:
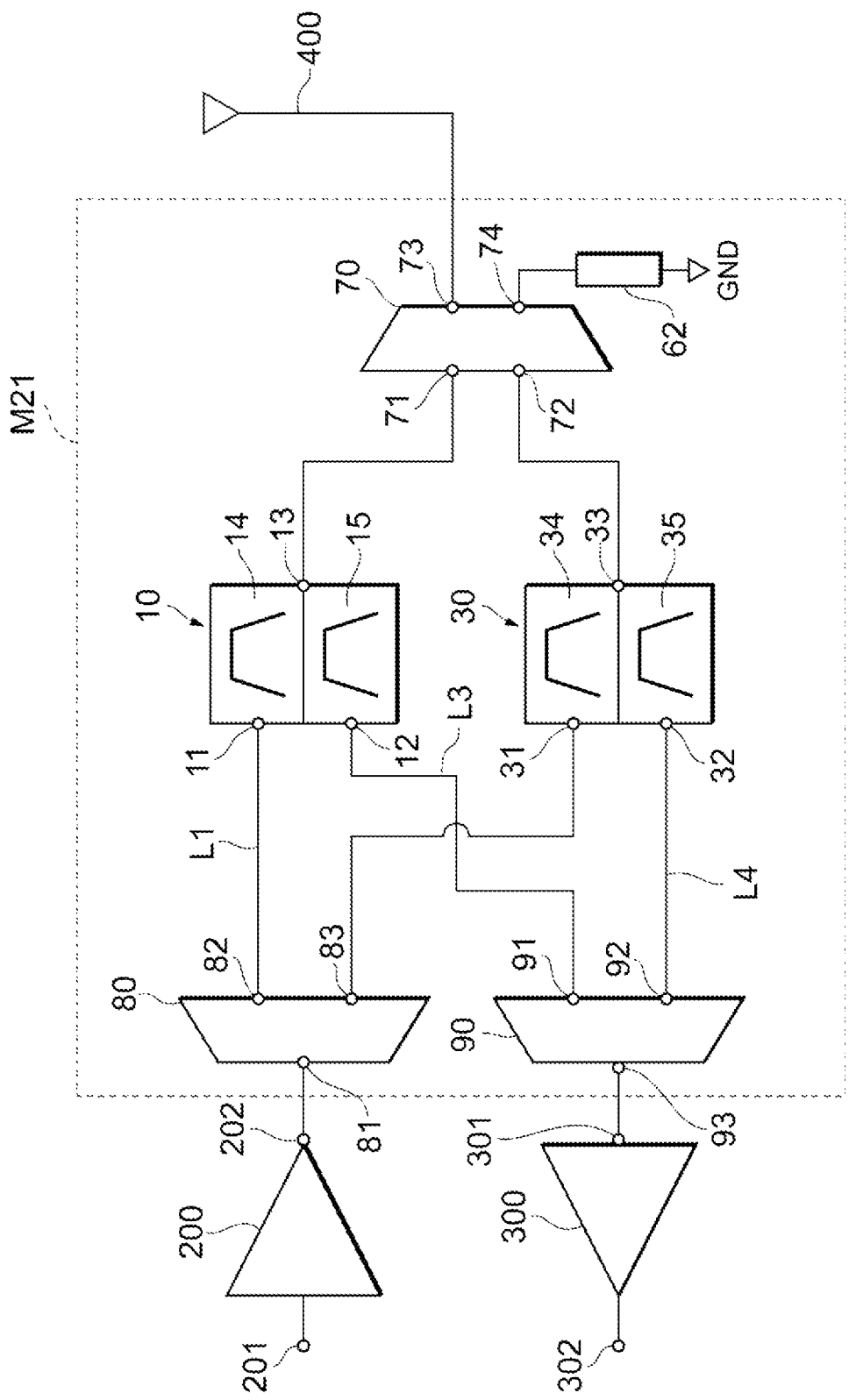
FIG. 8 illustrates the circuit configuration of a front-end module according to a third example of the disclosure.

FIG. 8 illustrates the circuit configuration of a front-end module M21 according to a third example of the disclosure. The front-end module M21 includes duplexers 10 and 30, a terminating circuit element 62, an antenna switch 70, a transmit-signal changing switch 80, and a received-signal changing switch 90. The front-end module M21 corresponds to an example of the front-end module M2 of the second embodiment, and includes all the elements of the front-end module M2. Although the band pass filter 50 in FIG. 2 is not shown in FIG. 8, a receive filter 35 of the duplexer 30 serves as the band pass filter 50. The front-end module M21 will be described below mainly by referring to the points different from the front-end module M2, and a detailed explanation of the same points will be omitted.

The duplexer 30 is a separator which separates a transmit signal C and a received signal C from each other. The duplexer 30 includes a transmit node 31, a receive node 32, a common node 33, a transmit filter 34, and a receive filter 35. The transmit filter 34 has frequency characteristics in which the frequency band of the transmit signal C is the pass band and the frequency band of the received signal C is the elimination band. The receive filter 35 has frequency characteristics in which the frequency band of the received signal C is the pass band and the frequency band of the transmit signal C is the elimination band.

While the duplexer 10 is being used for filtering of the transmit signal A, the duplexer 30 is not used for filtering of the transmit signal C. Hence, while the duplexer 10 is being used for filtering of the transmit signal A, the duplexer 30 (receive filter 35, for example) can be used for removing leakage components of the transmit signal A so as to prevent the leakage components from being input into the low-noise amplifier 300. The received-signal changing switch 90 receives the leakage components of the transmit signal A via the node 91 and outputs the leakage components from the node 92. In this case, the antenna switch 70 establishes a signal path between the nodes 72 and 74. The terminating circuit element 62 is connected between the node 74 and the ground GND. With this configuration, a signal path from the node 91 of the received-signal changing switch 90 to the ground GND is established via the node 92, the receive filter 35, the nodes 72 and 74 of the antenna switch 70, and the terminating circuit element 62 in this order. This signal path corresponds to the signal path L4 in FIG. 2, and the received-signal changing switch 90 serves as the branch point B2 in FIG. 2.

In this manner, by using the duplexer 30 which is not used for filtering of the transmit signal C, the leakage components of the transmit signal A can be removed and thus be prevented from being input into the low-noise amplifier 300. Additionally, the duplexer 30, which is a pre-equipped duplexer, can be used without necessarily the need to provide a special band pass filter for removing the leakage components of the transmit signal A, thereby reducing the cost and also decreasing the size of the front-end module M21.

By using the receive filter of a Band-2, Band-3, or Band-25 duplexer, leakage components of the transmit band of Band 1 can be removed.

Figure 9:
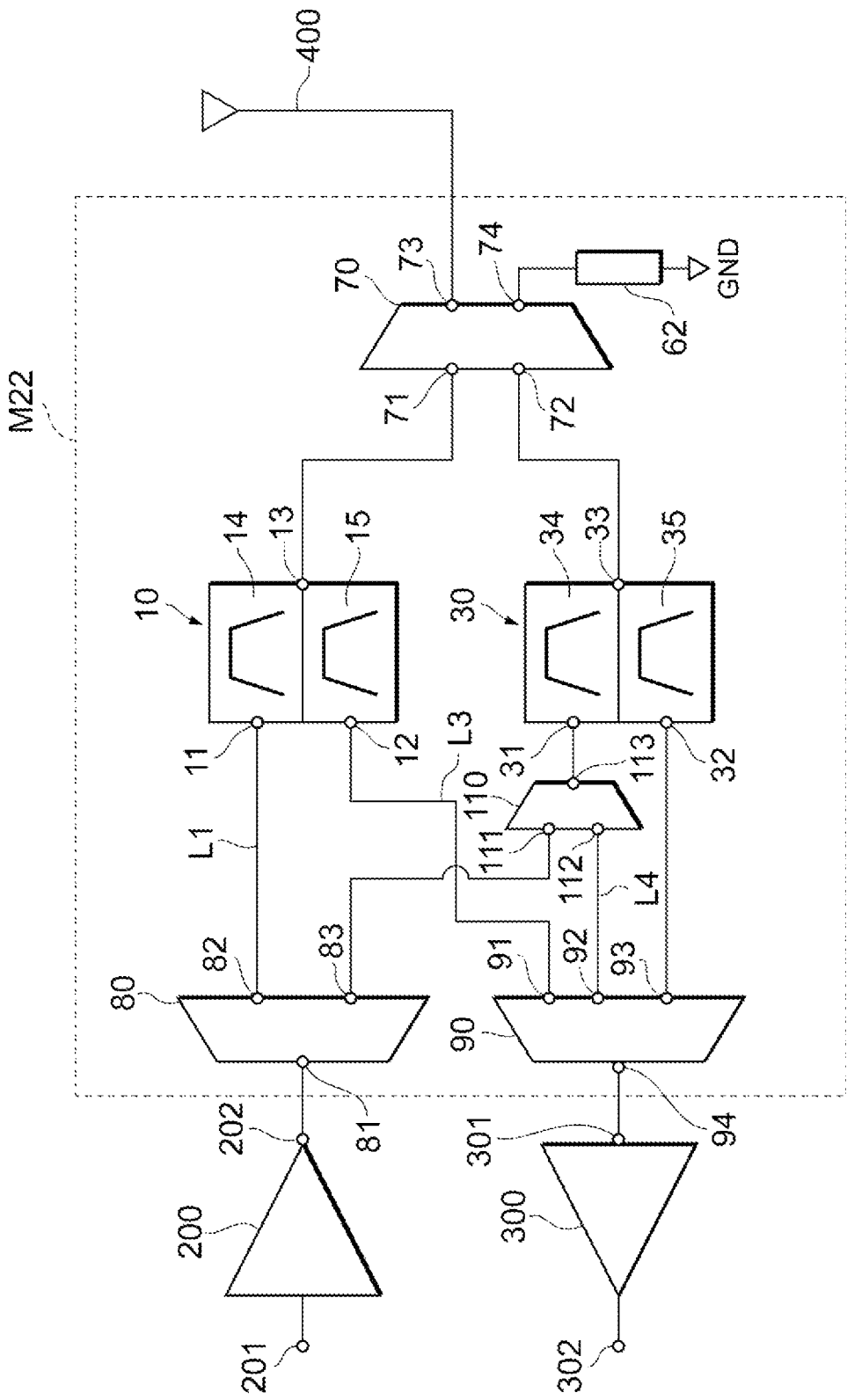
FIG. 9 illustrates the circuit configuration of a front-end module according to a fourth example of the disclosure.

FIG. 9 illustrates the circuit configuration of a front-end module M22 according to a fourth example of the disclosure. The front-end module M22 includes duplexers 10 and 30, a terminating circuit element 62, an antenna switch 70, a transmit-signal changing switch 80, a received-signal changing switch 90, and a switch 110. The front-end module M22 corresponds to an example of the front-end module M2 of the second embodiment, and includes all the elements of the front-end module M2. Although the band pass filter 50 in FIG. 2 is not shown in FIG. 9, a transmit filter 34 of the duplexer 30 serves as the band pass filter 50. The front-end module M22 will be described below mainly by referring to the points different from the front-end module M21, and a detailed explanation of the same points will be omitted.

The transmit-signal changing switch 80 includes nodes 81, 82, and 83, and selectively establishes a signal path among the nodes 81, 82, and 83. In one example, the transmit-signal changing switch 80 receives the transmit signal A from the power amplifier 200 via the node 81 and outputs the transmit signal A from the node 82. The node 82 is connected to the transmit node 11 of the duplexer 10 via the signal path L1. In another example, the transmit-signal changing switch 80 receives the transmit signal B from the power amplifier 200 via the node 81 and outputs the transmit signal B from the node 83. The node 83 is connected to the transmit node 31 of the duplexer 30 via the switch 110.

The received-signal changing switch 90 includes nodes 91, 92, 93, and 94, and selectively establishes a signal path among the nodes 91, 92, 93, and 94. In one example, the received-signal changing switch 90 receives the received signal A output from the receive node 12 of the duplexer 10 and input into the node 91 via the signal path L3 and outputs the received signal A from the node 94. In another example, the received-signal changing switch 90 receives the received signal B from the receive node 32 of the duplexer 30 via the node 93 and outputs the received signal B from the node 94. The node 94 is connected to the low-noise amplifier 300, and the received signals A and B output from the node 94 are input into the low-noise amplifier 300.

The switch 110 includes nodes 111, 112, and 113, and selectively establishes a signal path among the nodes 111, 112, and 113. For example, the switch 110 receives the transmit signal C from the node 83 of the transmit-signal changing switch 80 via the node 111 and outputs the transmit signal C from the node 113. The node 113 is connected to the transmit node 31 of the duplexer 30.

While the duplexer 10 is being used for filtering of the transmit signal A, the duplexer 30 is not used for filtering of the transmit signal C. Hence, while the duplexer 10 is being used for filtering of the transmit signal A, the duplexer 30 (transmit filter 34, for example) can be used for removing leakage components of the transmit signal A so as to prevent the leakage components from being input into the low-noise amplifier 300. The received-signal changing switch 90 receives the leakage components of the transmit signal A via the node 91 and outputs the leakage components from the node 92. In this case, the switch 110 establishes a signal path between the nodes 112 and 113, and the antenna switch 70 establishes a signal path between the nodes 72 and 74. The terminating circuit element 62 is connected between the node 74 and the ground GND. With this configuration, a signal path from the node 91 of the received-signal changing switch 90 to the ground GND is established via the node 92, the switch 110, the transmit filter 34, the nodes 72 and 74 of the antenna switch 70, and the terminating circuit element 62 in this order. This signal path corresponds to the signal path L4 in FIG. 2, and the received-signal changing switch 90 serves as the branch point B2 in FIG. 2. The front-end module M22 achieves advantages similar to those of the front-end module M21.

By using the transmit filter of a Band-2, Band-23, or Band-25 duplexer, leakage components of the transmit band of Band 1 can be removed.

Figure 10:
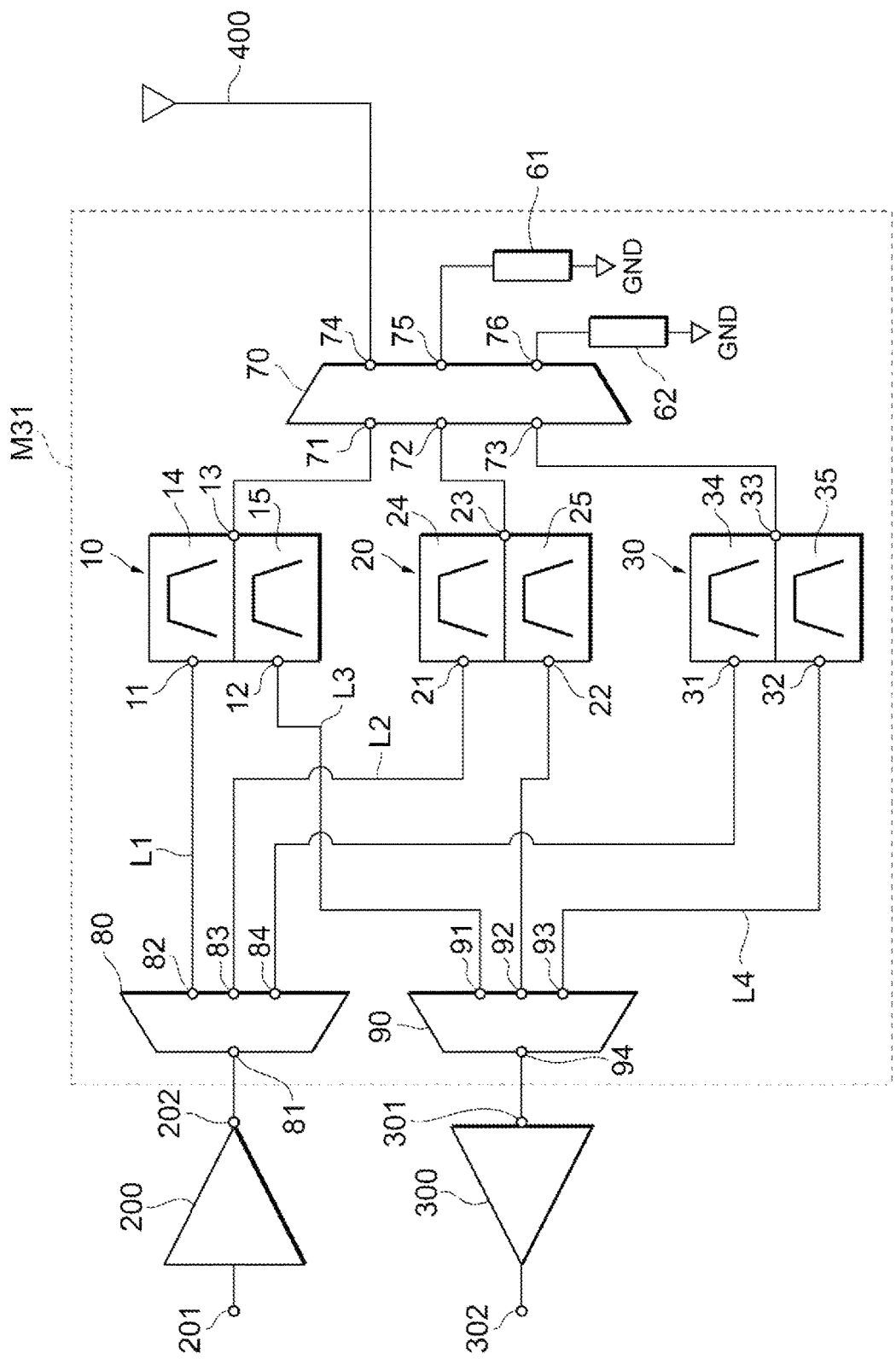
FIG. 10 illustrates the circuit configuration of a front-end module according to a fifth example of the disclosure.

FIG. 10 illustrates the circuit configuration of a front-end module M31 according to a fifth example of the disclosure. The front-end module M31 includes duplexers 10, 20, and 30, terminating circuit elements 61 and 62, an antenna switch 70, a transmit-signal changing switch 80, and a received-signal changing switch 90. The front-end module M31 corresponds to an example of the front-end module M3 of the third embodiment, and includes all the elements of the front-end module M3. Although the band pass filters 40 and 50 in FIG. 3 are not shown in FIG. 10, a transmit filter 24 of the duplexer 20 serves as the band pass filter 40, and a receive filter 35 of the duplexer 30 serves as the band pass filter 50. The front-end module M31 is constituted by a combination of the front-end modules M11 and M21.

The transmit-signal changing switch 80 includes nodes 81, 82, 83, and 84, and selectively establishes a signal path among the nodes 81, 82, 83, and 84. In one example, the transmit-signal changing switch 80 receives the transmit signal A from the power amplifier 200 via the node 81 and outputs the transmit signal A from the node 82. The node 82 is connected to the transmit node 11 of the duplexer 10 via the signal path L1. In another example, the transmit-signal changing switch 80 receives the transmit signal B from the power amplifier 200 via the node 81 and outputs the transmit signal B from the node 83. The node 83 is connected to the transmit node 21 of the duplexer 20 via the signal path L2. In another example, the transmit-signal changing switch 80 receives the transmit signal C from the power amplifier 200 via the node 81 and outputs the transmit signal C from the node 84. The node 84 is connected to the transmit node 31 of the duplexer 30.

The antenna switch 70 includes nodes 71, 72, 73, 74, 75, and 76, and selectively establishes a signal path among the nodes 71, 72, 73, 74, 75, and 76. In one example, the antenna switch 70 receives the transmit signal A from the common node 13 of the duplexer 10 via the node 71 and outputs the transmit signal A from the node 74. In another example, the antenna switch 70 receives the transmit signal B from the common node 23 of the duplexer 20 via the node 72 and outputs the transmit signal B from the node 74. In another example, the antenna switch 70 receives the transmit signal C from the common node 33 of the duplexer 30 via the node 73 and outputs the transmit signal C from the node 74. The node 74 is connected to the antenna 400, and the transmit signals A, B, and C output from the node 74 are transmitted from the antenna 400.

The received-signal changing switch 90 includes nodes 91, 92, 93, and 94, and selectively establishes a signal path among the nodes 91, 92, 93, and 94. In one example, the received-signal changing switch 90 receives the received signal A output from the receive node 12 of the duplexer 10 and input into the node 91 via the signal path L3 and outputs the received signal A from the node 94. In another example, the received-signal changing switch 90 receives the received signal B from the receive node 22 of the duplexer 20 via the node 92 and outputs the received signal B from the node 94. In another example, the received-signal changing switch 90 receives the received signal C output from the receive node 32 of the duplexer 30 and input into the node 93 via the signal path L4 and outputs the received signal C from the node 94. The node 94 is connected to the low-noise amplifier 300, and the received signals A, B, and C output from the node 94 are input into the low-noise amplifier 300.

While the duplexer 10 is being used for filtering of the transmit signal A, the duplexers 20 and 30 are not used for filtering of the transmit signals B and C, respectively. Hence, while the duplexer 10 is being used for filtering of the transmit signal A, the duplexer 20 (transmit filter 24, for example) can be used for removing unwanted components of the transmit signal A so as to prevent the unwanted components from being input into the duplexer 10. Likewise, while the duplexer 10 is being used for filtering of the transmit signal A, the duplexer 30 (receive filter 35, for example) can be used for removing leakage components of the transmit signal A so as to prevent the leakage components from being input into the low-noise amplifier 300.

The transmit-signal changing switch 80 receives the transmit signal A via the node 81 and outputs the transmit signal A from the nodes 82 and 83. In this case, the antenna switch 70 establishes a signal path between the nodes 72 and 75. The terminating circuit element 61 is connected between the node 75 and a ground GND. With this configuration, a signal path from the node 81 of the transmit-signal changing switch 80 to the ground GND is established via the node 83, the transmit filter 24, the nodes 72 and 75 of the antenna switch 70, and the terminating circuit element 61 in this order. This signal path corresponds to the signal path L2 in FIG. 1, and the transmit-signal changing switch 80 serves as the branch point B1 in FIG. 1.

The received-signal changing switch 90 receives leakage components of the transmit signal A via the node 91 and outputs the leakage components from the node 93. In this case, the antenna switch 70 establishes a signal path between the nodes 73 and 76. The terminating circuit element 62 is connected between the node 76 and a ground GND. With this configuration, a signal path from the node 91 of the received-signal changing switch 90 to the ground GND is established via the node 93, the receive filter 35, the nodes 73 and 76 of the antenna switch 70, and the terminating circuit element 62 in this order. This signal path corresponds to the signal path L4 in FIG. 2, and the received-signal changing switch 90 serves as the branch point B2 in FIG. 2. The front-end module M31 achieves advantages similar to those of the front-end module M11 and those of the front-end module M21. The transmit filter 24 of the duplexer 20 may serve as the band pass filter 40, and the transmit filter 34 of the duplexer 30 may serve as the band pass filter 50.

Figure 11:
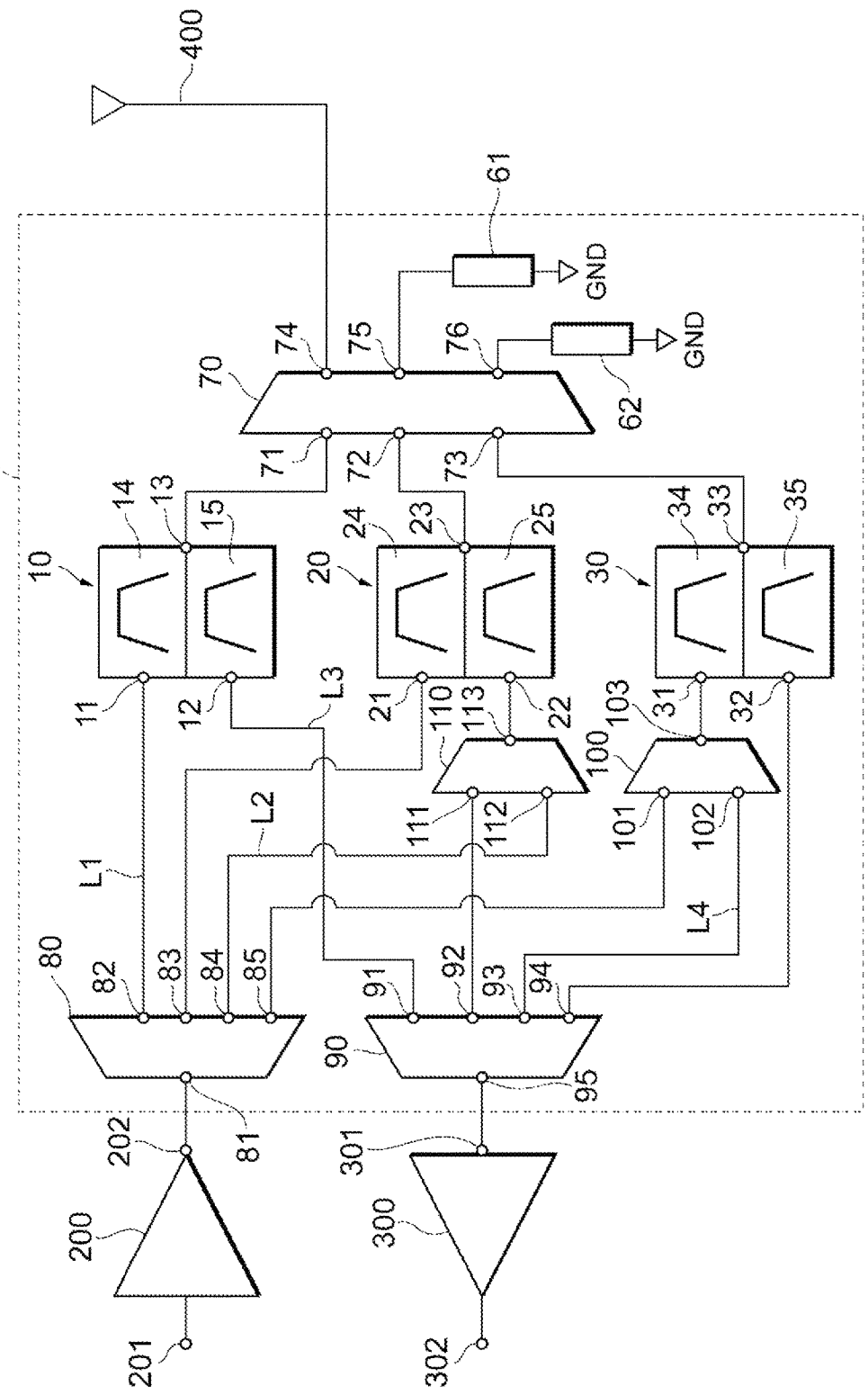
FIG. 11 illustrates the circuit configuration of a front-end module according to a sixth example of the disclosure.

FIG. 11 illustrates the circuit configuration of a front-end module M32 according to a sixth example of the disclosure. The front-end module M32 includes duplexers 10, 20, and 30, terminating circuit elements 61 and 62, an antenna switch 70, a transmit-signal changing switch 80, a received-signal changing switch 90, and switches 100 and 110. The front-end module M32 corresponds to an example of the front-end module M3 of the third embodiment, and includes all the elements of the front-end module M3. Although the band pass filters 40 and 50 in FIG. 3 are not shown in FIG. 11, a receive filter 25 of the duplexer 20 serves as the band pass filter 40, and a transmit filter 34 of the duplexer 30 serves as the band pass filter 50. The front-end module M32 is constituted by a combination of the front-end modules M12 and M22.

The transmit-signal changing switch 80 includes nodes 81, 82, 83, 84, and 85, and selectively establishes a signal path among the nodes 81, 82, 83, 84, and 85. In one example, the transmit-signal changing switch 80 receives the transmit signal A from the power amplifier 200 via the node 81 and outputs the transmit signal A from the node 82. The node 82 is connected to the transmit node 11 of the duplexer 10 via the signal path L1. In another example, the transmit-signal changing switch 80 receives the transmit signal B from the power amplifier 200 via the node 81 and outputs the transmit signal B from the node 83. The node 83 is connected to the transmit node 21 of the duplexer 20. In another example, the transmit-signal changing switch 80 receives the transmit signal C from the power amplifier 200 via the node 81 and outputs the transmit signal C from the node 85. The node 85 is connected to the transmit node 31 of the duplexer 30 via the switch 100.

The received-signal changing switch 90 includes nodes 91, 92, 93, 94, and 95, and selectively establishes a signal path among the nodes 91, 92, 93, 94, and 95. In one example, the received-signal changing switch 90 receives the received signal A output from the receive node 12 of the duplexer 10 and input into the node 91 via the signal path L3 and outputs the received signal A from the node 95. In another example, the received-signal changing switch 90 receives the received signal B output from the receive node 22 of the duplexer 20 and input into the node 92 via the switch 110 and outputs the received signal B from the node 95. In another example, the received-signal changing switch 90 receives the received signal C from the receive node 32 of the duplexer 30 via the node 94 and outputs the received signal C from the node 95. The node 95 is connected to the low-noise amplifier 300, and the received signals A, B, and C output from the node 95 are input into the low-noise amplifier 300.

The switch 110 includes nodes 111, 112, and 113, and selectively establishes a signal path among the nodes 111, 112, and 113. For example, the switch 110 receives the received signal B from the receive node 22 of the duplexer 20 via the node 113 and outputs the received signal B from the node 111. The node 111 is connected to the node 92 of received-signal changing switch 90.

The switch 100 includes nodes 101, 102, and 103, and selectively establishes a signal path among the nodes 101, 102, and 103. For example, the switch 100 receives the transmit signal C from the node 85 via the node 101 and outputs the transmit signal C from the node 103. The node 103 is connected to the transmit node 31 of the duplexer 30.

While the duplexer 10 is being used for filtering of the transmit signal A, the duplexers 20 and 30 are not used for filtering of the transmit signals B and C, respectively. Hence, while the duplexer 10 is being used for filtering of the transmit signal A, the duplexer 20 (receive filter 25, for example) can be used for removing unwanted components of the transmit signal A so as to prevent the unwanted components from being input into the duplexer 10. Likewise, while the duplexer 10 is being used for filtering of the transmit signal A, the duplexer 30 (transmit filter 34, for example) can be used for removing leakage components of the transmit signal A so as to prevent the leakage components from being input into the low-noise amplifier 300.

The transmit-signal changing switch 80 receives the transmit signal A via the node 81 and outputs the transmit signal A from the nodes 82 and 84. In this case, the switch 110 establishes a signal path between the nodes 112 and 113, and the antenna switch 70 establishes a signal path between the nodes 72 and 75. The terminating circuit element 61 is connected between the node 75 and a ground GND. With this configuration, a signal path from the node 81 of the transmit-signal changing switch 80 to the ground GND is established via the node 84, the switch 110, the receive filter 25, the nodes 72 and 75 of the antenna switch 70, and the terminating circuit element 61 in this order. This signal path corresponds to the signal path L2 in FIG. 1, and the transmit-signal changing switch 80 serves as the branch point B1 in FIG. 1.

The received-signal changing switch 90 receives leakage components of the transmit signal A via the node 91 and outputs the leakage components from the node 93. In this case, the switch 100 establishes a signal path between the nodes 102 and 103, and the antenna switch 70 establishes a signal path between the nodes 73 and 76. The terminating circuit element 62 is connected between the node 76 and a ground GND. With this configuration, a signal path from the node 91 of the received-signal changing switch 90 to the ground GND is established via the node 93, the switch 100, the transmit filter 34, the nodes 73 and 76 of the antenna switch 70, and the terminating circuit element 62 in this order. This signal path corresponds to the signal path L4 in FIG. 2, and the received-signal changing switch 90 serves as the branch point B2 in FIG. 2. The front-end module M32 achieves advantages similar to those of the front-end module M31. The receive filter 25 of the duplexer 20 may serve as the band pass filter 40, and the receive filter 35 of the duplexer 30 may serve as the band pass filter 50.

Figure 12:
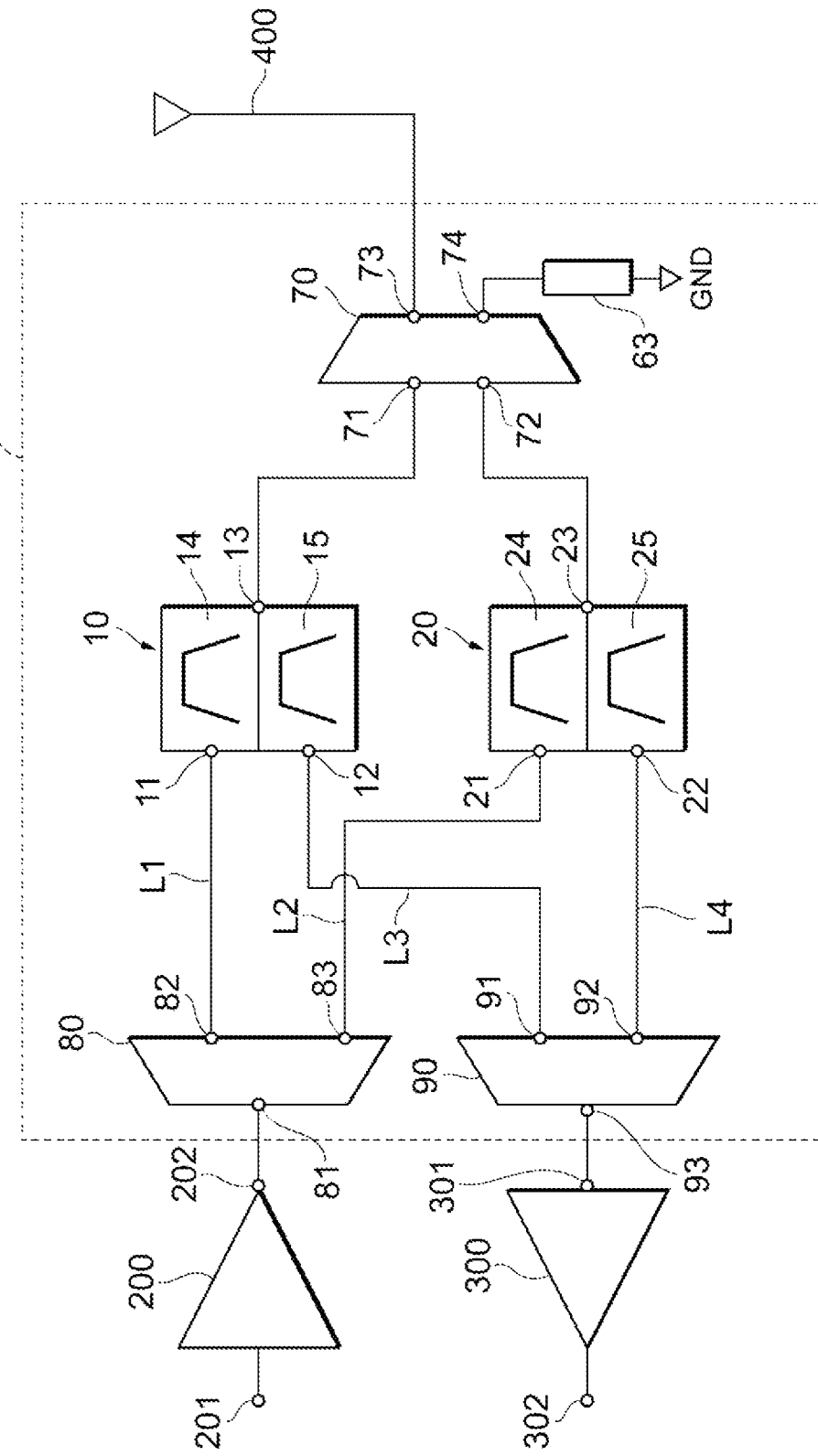
FIG. 12 illustrates the circuit configuration of a front-end module according to a seventh example of the disclosure.

FIG. 12 illustrates the circuit configuration of a front-end module M41 according to a seventh example of the disclosure. The front-end module M41 includes duplexers 10 and 20, a terminating circuit element 63, an antenna switch 70, a transmit-signal changing switch 80, and a received-signal changing switch 90. The front-end module M41 corresponds to an example of the front-end module M4 of the fourth embodiment, and includes all the elements of the front-end module M4. Although the band pass filters 40 and 50 in FIG. 4 are not shown in FIG. 12, a transmit filter 24 of the duplexer 20 serves as the band pass filter 40, and a receive filter 25 of the duplexer 20 serves as the band pass filter 50.

While the duplexer 10 is being used for filtering of the transmit signal A, the duplexer 20 is not used for filtering of the transmit signal B. Hence, while the duplexer 10 is being used for filtering of the transmit signal A, the duplexer 20 (transmit filter 24, for example) can be used for removing unwanted components of the transmit signal A so as to prevent the unwanted components from being input into the duplexer 10. Likewise, while the duplexer 10 is being used for filtering of the transmit signal A, the duplexer 20 (receive filter 25, for example) can be used for removing leakage components of the transmit signal A so as to prevent the leakage components from being input into the low-noise amplifier 300.

The transmit-signal changing switch 80 receives the transmit signal A via the node 81 and outputs the transmit signal A from the nodes 82 and 83. In this case, the antenna switch 70 establishes a signal path between the nodes 72 and 74. The terminating circuit element 63 is connected between the node 74 and a ground GND. With this configuration, a signal path from the node 81 of the transmit-signal changing switch 80 to the ground GND is established via the node 83, the transmit filter 24, the nodes 72 and 74 of the antenna switch 70, and the terminating circuit element 63 in this order. This signal path corresponds to the signal path L2 in FIG. 4, and the transmit-signal changing switch 80 serves as the branch point B1 in FIG. 4.

The received-signal changing switch 90 receives leakage components of the transmit signal A via the node 91 and outputs the leakage components from the node 92. With this configuration, a signal path from the node 91 of the received-signal changing switch 90 to the ground GND is established via the node 92, the receive filter 25, the nodes 72 and 74 of the antenna switch 70, and the terminating circuit element 63 in this order. This signal path corresponds to the signal path L4 in FIG. 4, and the received-signal changing switch 90 serves as the branch point B2 in FIG. 4. The front-end module M41 achieves advantages similar to those of the front-end module M31 and those of the front-end module M32.

Figure 13:
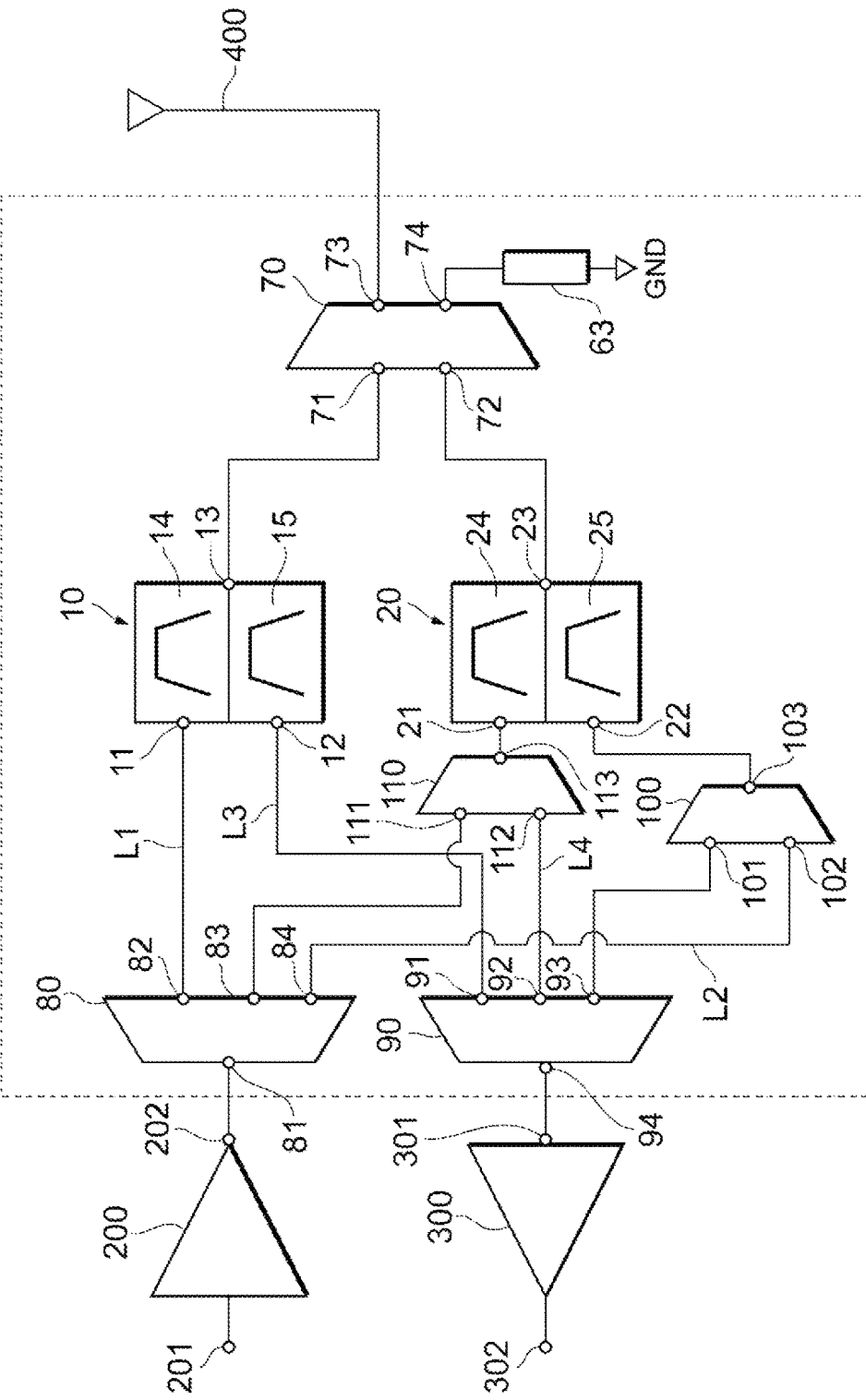
FIG. 13 illustrates the circuit configuration of a front-end module according to an eighth example of the disclosure.

FIG. 13 illustrates the circuit configuration of a front-end module M42 according to an eighth example of the disclosure. The front-end module M42 includes duplexers 10 and 20, a terminating circuit element 63, an antenna switch 70, a transmit-signal changing switch 80, a received-signal changing switch 90, and switches 100 and 110. The front-end module M42 corresponds to an example of the front-end module M4 of the fourth embodiment, and includes all the elements of the front-end module M4. Although the band pass filters 40 and 50 in FIG. 4 are not shown in FIG. 13, a receive filter 25 of the duplexer 20 serves as the band pass filter 40, and a transmit filter 24 of the duplexer 20 serves as the band pass filter 50.

The transmit-signal changing switch 80 includes nodes 81, 82, 83, and 84, and selectively establishes a signal path among the nodes 81, 82, 83, and 84. In one example, the transmit-signal changing switch 80 receives the transmit signal A from the power amplifier 200 via the node 81 and outputs the transmit signal A from the node 82. The node 82 is connected to the transmit node 11 of the duplexer 10 via the signal path L1. In another example, the transmit-signal changing switch 80 receives the transmit signal B from the power amplifier 200 via the node 81 and outputs the transmit signal B from the node 83. The node 83 is connected to the transmit node 21 of the duplexer 20 via the switch 110.

The received-signal changing switch 90 includes nodes 91, 92, 93, and 94, and selectively establishes a signal path among the nodes 91, 92, 93, and 94. In one example, the received-signal changing switch 90 receives the received signal A output from the receive node 12 of the duplexer 10 and input into the node 91 via the signal path L3 and outputs the received signal A from the node 94. In another example, the received-signal changing switch 90 receives the received signal B output from the receive node 22 of the duplexer 20 and input into the node 93 via the switch 100 and outputs the received signal B from the node 94. The node 94 is connected to the low-noise amplifier 300, and the received signals A and B output from the node 94 are input into the low-noise amplifier 300.

The switch 110 includes nodes 111, 112, and 113, and selectively establishes a signal path among the nodes 111, 112, and 113. For example, the switch 110 receives the transmit signal B from the node 83 of the transmit-signal changing switch 80 via the node 111 and outputs the transmit signal B from the node 113. The node 113 is connected to the transmit node 21 of the duplexer 20.

The switch 100 includes nodes 101, 102, and 103, and selectively establishes a signal path among the nodes 101, 102, and 103. For example, the switch 100 receives the received signal C from the receive node 22 of the duplexer 20 via the node 103 and outputs the received signal C from the node 101. The node 101 is connected to the node 93 of the received-signal changing switch 90.

While the duplexer 10 is being used for filtering of the transmit signal A, the duplexer 20 is not used for filtering of the transmit signal B. Hence, while the duplexer 10 is being used for filtering of the transmit signal A, the duplexer 20 (receive filter 25, for example) can be used for removing unwanted components of the transmit signal A so as to prevent the unwanted components from being input into the duplexer 10. Likewise, while the duplexer 10 is being used for filtering of the transmit signal A, the duplexer 20 (transmit filter 24, for example) can be used for removing leakage components of the transmit signal A so as to prevent the leakage components from being input into the low-noise amplifier 300.

The transmit-signal changing switch 80 receives the transmit signal A via the node 81 and outputs the transmit signal A from the nodes 82 and 84. In this case, the switch 100 establishes a signal path between the nodes 102 and 103, and the antenna switch 70 establishes a signal path between the nodes 72 and 74. The terminating circuit element 63 is connected between the node 74 and a ground GND. With this configuration, a signal path from the node 81 of the transmit-signal changing switch 80 to the ground GND is established via the node 84, the switch 100, the receive filter 25, the nodes 72 and 74 of the antenna switch 70, and the terminating circuit element 63 in this order. This signal path corresponds to the signal path L2 in FIG. 4, and the transmit-signal changing switch 80 serves as the branch point B1 in FIG. 4.

The received-signal changing switch 90 receives leakage components of the transmit signal A via the node 91 and outputs the leakage components from the node 92. In this case, the switch 110 establishes a signal path between the nodes 112 and 113. With this configuration, a signal path from the node 91 of the received-signal changing switch 90 to the ground GND is established via the node 92, the switch 110, the transmit filter 24, the nodes 72 and 74 of the antenna switch 70, and the terminating circuit element 63 in this order. This signal path corresponds to the signal path L4 in FIG. 4, and the received-signal changing switch 90 serves as the branch point B2 in FIG. 4. The front-end module M42 achieves advantages similar to those of the front-end module M41.

In this specification, when the duplexers 10, 20, and 30 are distinguished from each other, the duplexer 10 may be called a first duplexer, the duplexer 20 may be called a second duplexer, and the duplexer 30 may be called a third duplexer. When the transmit filters 14, 24, and 34 are distinguished from each other, the transmit filter 14 may be called a first transmit filter, the transmit filter 24 may be called a second transmit filter, and the transmit filter 34 may be called a third transmit filter. When the receive filters 15, 25, and 35 are distinguished from each other, the receive filter 15 may be called a first receive filter, the receive filter 25 may be called a second receive filter, and the receive filter 35 may be called a third receive filter. When the transmit signals A, B, and C are distinguished from each other, the transmit signal A may be called a first transmit signal, the transmit signal B may be called a second transmit signal, and the transmit signal C may be called a third transmit signal. When the received signals A, B, and C are distinguished from each other, the received signal A may be called a first received signal, the received signal B may be called a second received signal, and the received signal C may be called a third received signal. When the band pass filters 40 and 50 are distinguished from each other, the band pass filter 40 may be called a first band pass filter, and the band pass filter 50 may be called a second band pass filter. When the terminating circuit elements 61 and 62 are distinguished from each other, the terminating circuit element 61 may be called a first terminating circuit element, and the terminating circuit element 62 may be called a second terminating circuit element. When the signal paths L1, L2, L3, and L4 are distinguished from each other, the signal path L1 may be called a first signal path, the signal path L2 may be called a second signal path, the signal path L3 may be called a third signal path, and the signal path L4 may be called a fourth signal path.

The above-described embodiments are provided for facilitating the understanding of the disclosure, but are not intended to be exhaustive or to limit the disclosure to the precise forms disclosed. Modifications and/or improvements may be made on the embodiments without necessarily departing from the scope and spirit of the disclosure, and equivalents of the embodiments are also encompassed in the disclosure. That is, suitable design changes made to the embodiments by those skilled in the art are also encompassed in the disclosure within the scope and spirit of the disclosure. For example, the circuit elements and the positions thereof of the embodiments are not restricted to those described in the embodiments and may be changed in an appropriate manner. For example, the expression "a circuit element A is connected to a circuit element B" includes a situation where the circuit element A is directly connected to the circuit element B and also a situation where a signal path is selectively established between the circuit elements A and B via a circuit element C (a switch element, for example). The circuit elements of the embodiments may be combined together within a technically possible range, and configurations obtained by combining the circuit elements of the embodiments are also encompassed in the disclosure within the scope and spirit of the disclosure. In the above-described examples, the signal path L2 is established by using the transmit-signal changing switch 80 and the signal path L4 is established by using the received-signal changing switch 90, with the additional use of the switch 100 or 110 if necessary. However, the use of the switches to establish the signal paths L2 and L4 is not restricted to the configurations in the examples, and may be changed in an appropriate manner.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A front-end module comprising:
a first duplexer comprising:
a transmit node,
a receive node,
a common node,
a first transmit filter, and
a first receive filter, wherein:
a first signal path connects the transmit node and an output terminal of a power amplifier,
the first transmit filter has a pass band including a frequency band of a first transmit signal passing through the transmit node and the common node, and a stop band including a frequency band of a first received signal passing through the common node and the receive node, and
the first receive filter has a pass band including the frequency band of the first received signal, and a stop band including the frequency band of the first transmit signal;
a first band pass filter disposed in a second signal path, the second signal path connecting the first signal path to ground, wherein the first band pass filter has a pass band including frequency components of the first transmit signal that overlap the stop band of the first transmit filter are allowed to pass through the first band pass filter; and
a terminating circuit element disposed in the second signal path between the first band pass filter and ground, the terminating circuit element being configured to attenuate the frequency components of the first transmit signal passing through the first band pass filter.

2. The front-end module according to claim 1, wherein the pass band of the first band pass filter further includes frequency components that overlap at least part of the pass band of the first receive filter.

3. The front-end module according to claim 2, wherein:
the first band pass filter is a second transmit filter of a second duplexer or a second receive filter of the second duplexer;
the second transmit filter has a pass band including a frequency band of a second transmit signal, which is different from the frequency band of the first transmit signal, and a stop band including a frequency band of a second received signal, which is different from the frequency band of the first received signal; and
the second receive filter has a pass band including the frequency band of the second received signal and a stop band including the frequency band of the second transmit signal.

4. The front-end module according to claim 1, further comprising:
a second band pass filter disposed in a fourth signal path, the fourth signal path connecting a third signal path to ground, the third signal path connecting the receive node and an input terminal of a low-noise amplifier, wherein the second band pass filter has a pass band including frequency components of the first transmit signal that overlap at least part of the pass band of the first transmit filter and that are output from the receive node; and
a second terminating circuit element disposed in the fourth signal path between the second band pass filter and ground, the second terminating circuit element being configured to attenuate the first transmit signal passing through the second band pass filter.

5. The front-end module according to claim 4, wherein:
the first band pass filter is a second transmit filter of a second duplexer or a second receive filter of the second duplexer;
the second transmit filter has a pass band including a frequency band of a second transmit signal, which is different from the frequency band of the first transmit signal, and a stop band including a frequency band of a second received signal, which is different from the frequency band of the first received signal; and
the second receive filter has a pass band including the frequency band of the second received signal and a stop band including the frequency band of the second transmit signal.

6. The front-end module according to claim 4, wherein:
the second band pass filter is a second transmit filter of a second duplexer or a second receive filter of the second duplexer;
the second transmit filter has a pass band including a frequency band of a second transmit signal, which is different from the frequency band of the first transmit signal, and a stop band including a frequency band of a second received signal, which is different from the frequency band of the first received signal; and
the second receive filter has a pass band including the frequency band of the second received signal and a stop band including the frequency band of the second transmit signal.

7. The front-end module according to claim 4, wherein:
the first band pass filter is a second transmit filter of a second duplexer or a second receive filter of the second duplexer;
the second band pass filter is a third transmit filter of a third duplexer or a third receive filter of the third duplexer;
the second transmit filter has a pass band including a frequency band of a second transmit signal, which is different from the frequency band of the first transmit signal, and a stop band including a frequency band of a second received signal, which is different from the frequency band of the first received signal;
the second receive filter has a pass band including the second received signal and a stop band including the frequency band of the second transmit signal;
the third transmit filter has a pass band including a frequency band of a third transmit signal, which is different from the frequency band of the first transmit signal and the frequency band of the second transmit signal, and a stop band including a frequency band of a third received signal, which is different from the frequency band of the first received signal and the frequency band of the second received signal; and
the third receive filter has a pass band including the frequency band of the third received signal and a stop band including the frequency band of the third transmit signal.

8. The front-end module according to claim 4, wherein:
the first band pass filter is a second transmit filter of a second duplexer;
the second band pass filter is a second receive filter of the second duplexer;
the second transmit filter has a pass band including a frequency band of a second transmit signal, which is different from the frequency band of the first transmit signal, and a stop band including a frequency band of a second received signal, which is different from the frequency band of the first received signal; and the second receive filter has a pass band including the frequency band of the second received signal and a stop band including the frequency band of the second transmit signal.

9. The front-end module according to claim 4, wherein:
the first band pass filter is a second receive filter of a second duplexer;
the second band pass filter is a second transmit filter of the second duplexer;
the second transmit filter has a pass band including a frequency band of a second transmit signal, which is different from the frequency band of the first transmit signal, and a stop band including a frequency band of a second received signal, which is different from the frequency band of the first received signal; and
the second receive filter has a pass band including the frequency band of the second received signal and a stop band including the frequency band of the second transmit signal.

10. The front-end module according to claim 1, further comprising:
a second band pass filter disposed in a fourth signal path, the fourth signal path connecting a third signal path to ground, the third signal path connecting the receive node and an input terminal of a low-noise amplifier,
wherein the second band pass filter has a pass band including frequency components of the first transmit signal that overlap at least part of the pass band of the first transmit filter and that are output from the receive node, and
wherein the first band pass filter and the second band pass filter are connected to each other at a node, and the terminating circuit element is connected between the node and ground, the terminating circuit element being configured to attenuate the first transmit signal passing through the first band pass filter and the first transmit signal passing through the second band pass filter.

11. The front-end module according to claim 10, wherein:
the second band pass filter is a second transmit filter of a second duplexer or a second receive filter of the second duplexer;
the second transmit filter has a pass band including a frequency band of a second transmit signal, which is different from the frequency band of the first transmit signal, and a stop band including a frequency band of a second received signal, which is different from the frequency band of the first received signal; and
the second receive filter has a pass band including the frequency band of the second received signal and a stop band including the frequency band of the second transmit signal.

12. The front-end module according to claim 1, wherein:
the first band pass filter is a second transmit filter of a sceond duplexer or a second receive filter of the second duplexer;
the second transmit filter has a pass band including a frequency band of a second transmit signal, which is different from the frequency band of the first transmit signal, and a stop band including a frequency band of a second received signal, which is different from the frequency band of the first received signal; and
the second receive filter has a pass band including the frequency band of the second received signal and a stop band including the frequency band of the second transmit signal.

13. A front-end module comprising:
a first duplexer comprising:
a transmit node,
a receive node,
a common node,
a first transmit filter, and
a first receiver filter, wherein:
a third signal path connects the receive node and an input terminal of a low-noise amplifier,
the first transmit filter has a pass band including a frequency band of a first transmit signal passing through the transmit node and the common node, and a stop band including a frequency band of a first received signal passing through the common node and the receive node, and
the first receive filter has a pass band including the frequency band of the first received signal, and a stop band including the frequency band of the first transmit signal;
a second band pass filter disposed in a fourth signal path, the fourth signal path connecting the third signal path to ground, wherein the second band pass filter has a pass band including frequency components of the first transmit signal that overlap at least part of the pass band of the first transmit filter and that are output from the receive node; and
a terminating circuit element disposed in the fourth signal path between the second band pass filter and ground, the terminating circuit element being configured to attenuate the first transmit signal passing through the second band pass filter.

14. The front-end module according to claim 13, wherein:
the second band pass filter is a second transmit filter of a second duplexer or a second receive filter of the second duplexer;
the second transmit filter has a pass band including a frequency band of a second transmit signal, which is different from the frequency band of the first transmit signal, and a stop band including a frequency band of a second received signal, which is different from the frequency band of the first received signal; and
the second receive filter has a pass band including the frequency band of the second received signal and a stop band including the frequency band of the second transmit signal.

* * * * *